(12) United States Patent
Vos et al.

(10) Patent No.: US 8,324,116 B2
(45) Date of Patent: Dec. 4, 2012

(54) SUBSTRATE TREATING METHOD AND METHOD OF MANUFACTURING SEMICONDUCTOR DEVICE USING THE SAME

(75) Inventors: Rita Vos, Tremelo (BE); Paul Mertens, Bonheiden (BE); Tom Schram, Rixensart (BE); Masayuki Wada, Kyoto (JP)

(73) Assignees: IMEC (BE); Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 12/813,823

(22) Filed: Jun. 11, 2010

(65) Prior Publication Data
US 2010/0317185 A1 Dec. 16, 2010

(30) Foreign Application Priority Data
Jun. 12, 2009 (JP) .................. 2009-140740

(51) Int. Cl.
*H01L 21/28* (2006.01)
(52) U.S. Cl. ............... 438/785; 438/591; 257/E21.19
(58) Field of Classification Search .................. 438/745, 438/785, 591
See application file for complete search history.

(56) References Cited

U.S. PATENT DOCUMENTS

| | | | |
|---|---|---|---|
| 2003/0064604 A1 | 4/2003 | Umeda | |
| 2006/0011584 A1* | 1/2006 | Itano et al. | 216/83 |
| 2006/0049140 A1 | 3/2006 | Mizuno et al. | |
| 2007/0102767 A1 | 5/2007 | Cho et al. | |
| 2007/0122752 A1 | 5/2007 | Asako et al. | |
| 2009/0053885 A1* | 2/2009 | Sakamoto et al. | 438/594 |

FOREIGN PATENT DOCUMENTS

| | | |
|---|---|---|
| JP | 11-297656 | 10/1999 |
| JP | 2000-4010 | 1/2000 |
| JP | 2003-115576 | 4/2003 |
| JP | 2004-273799 | 9/2004 |
| JP | 2007-201215 | 8/2007 |
| JP | 2008-182187 | 8/2008 |
| KR | 10-0541817 | 1/2006 |
| KR | 10-0810163 | 2/2008 |
| WO | 2007/064982 | 6/2007 |

OTHER PUBLICATIONS

Decision to Grant issued on Feb. 16, 2012 in connection with corresponding Korean Patent Application No. 10-2010-0054656.
Korean Office Action dated Jun. 29, 2011 issued in connection with corresponding Korean Patent Application No. 10-2010-0054656.
Extended European Search Report dated Jul. 6, 2011 issued in connection with corresponding European Patent Application No. 10006027.6.

* cited by examiner

*Primary Examiner* — Alexander Ghyka
(74) *Attorney, Agent, or Firm* — Ostrolenk Faber LLP

(57) ABSTRACT

A substrate treating method comprising a step of preparing a semiconductor substrate (W, 11) which has an oxide film (13, 14) containing at least one of a rare earth oxide and an alkaline earth oxide, at least a portion of the oxide film (13, 14) being exposed, and a rinse step of supplying the oxide film (13, 14) on the semiconductor substrate (W, 11) with a rinse liquid made of an alkaline chemical or an organic solvent. Preferably, the alkaline chemical is an alkaline aqueous solution having a pH of more than 7. Further, preferably, the organic solvent is a high concentration organic solvent having a concentration of substantially 100%.

3 Claims, 13 Drawing Sheets

CHEMICAL
PROCESS

RINSE
(DISPLACEMENT)

SPIN DRY

RINSE
(CLEANING)

SPIN DRY

FIG. 7B (1st cap deposition)

FIG. 7C (Masking)

FIG. 7 D (Selective wet etch of first cap layer)
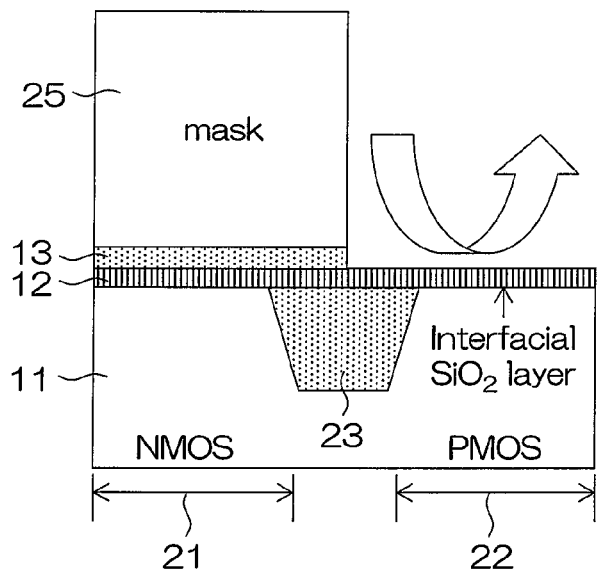
FIG. 7 E (Mask strip)
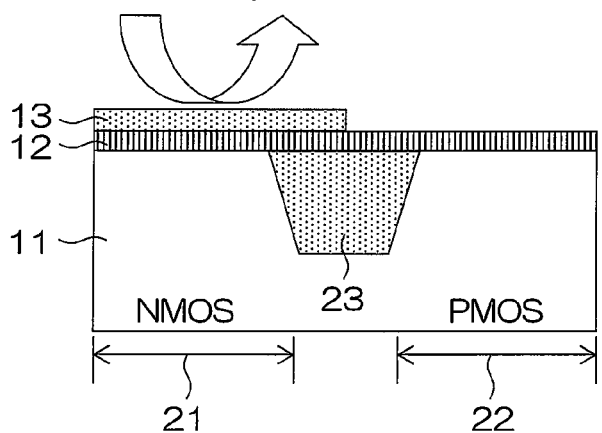
FIG. 7 F (Host dielectric deposition)
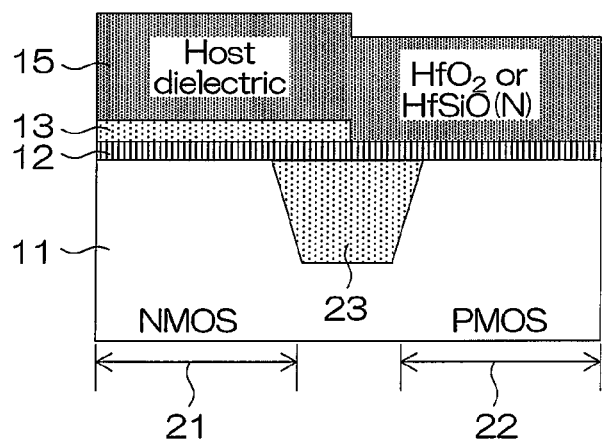

FIG. 7G (2nd cap deposition)
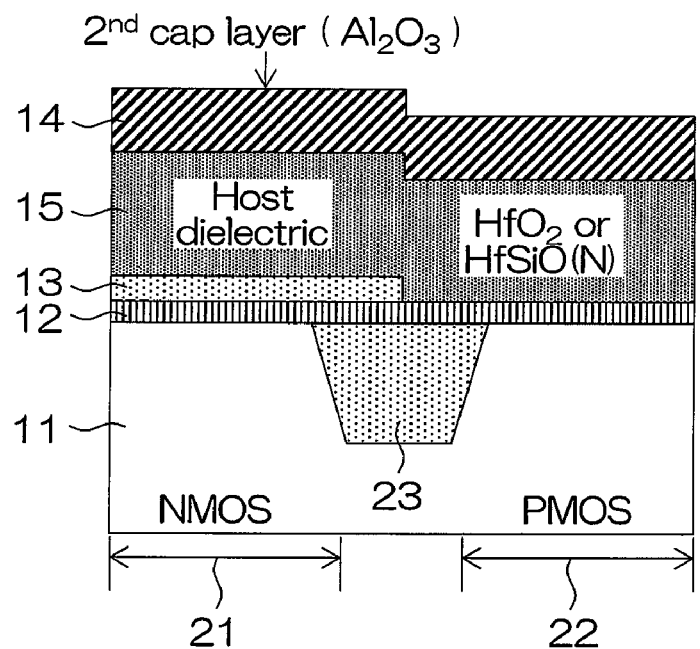
FIG. 7H (Masking)
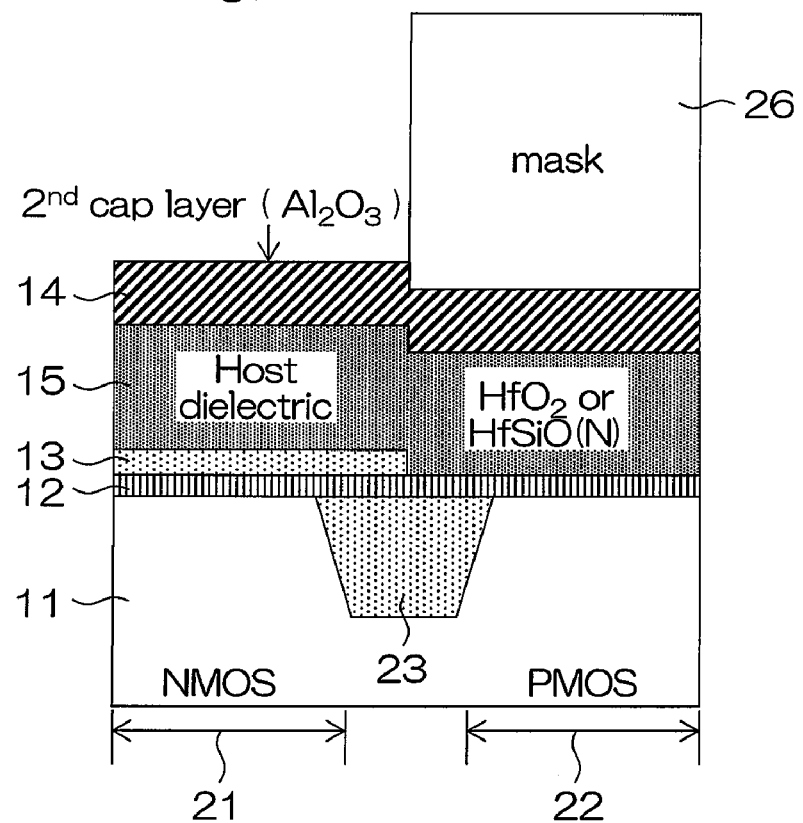

FIG. 7 I (Selective wet etch of 2nd cap layer)
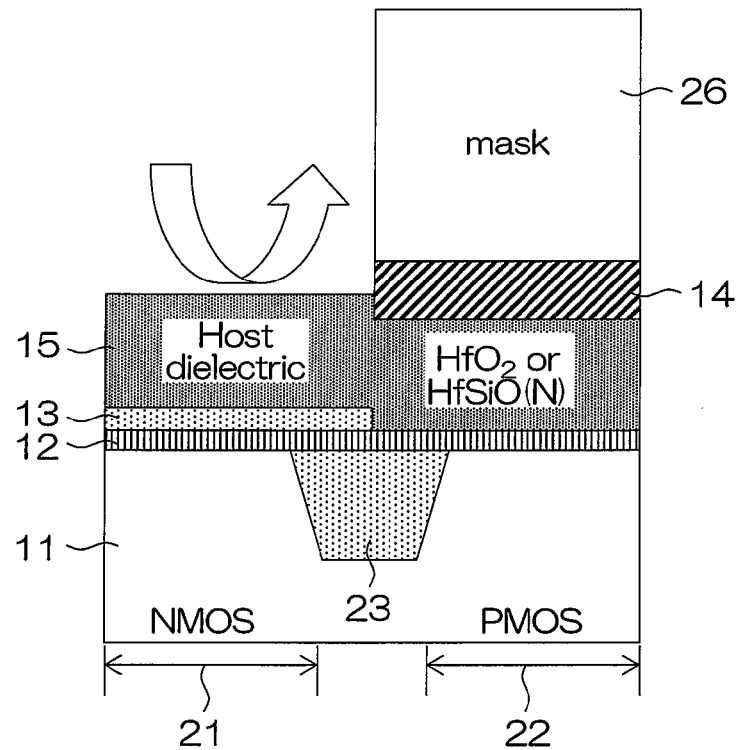
FIG. 7 J (Mask strip)
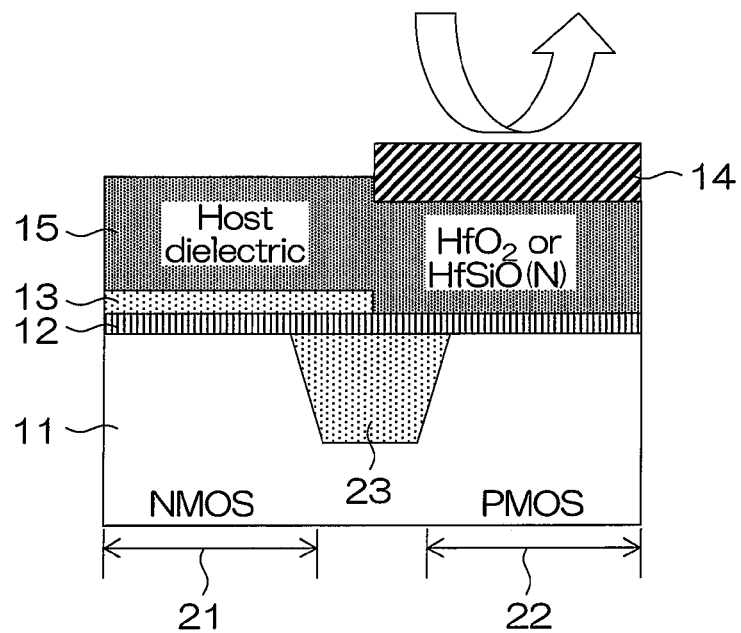

FIG. 7K (Metal deposition & Am. Si deposition)
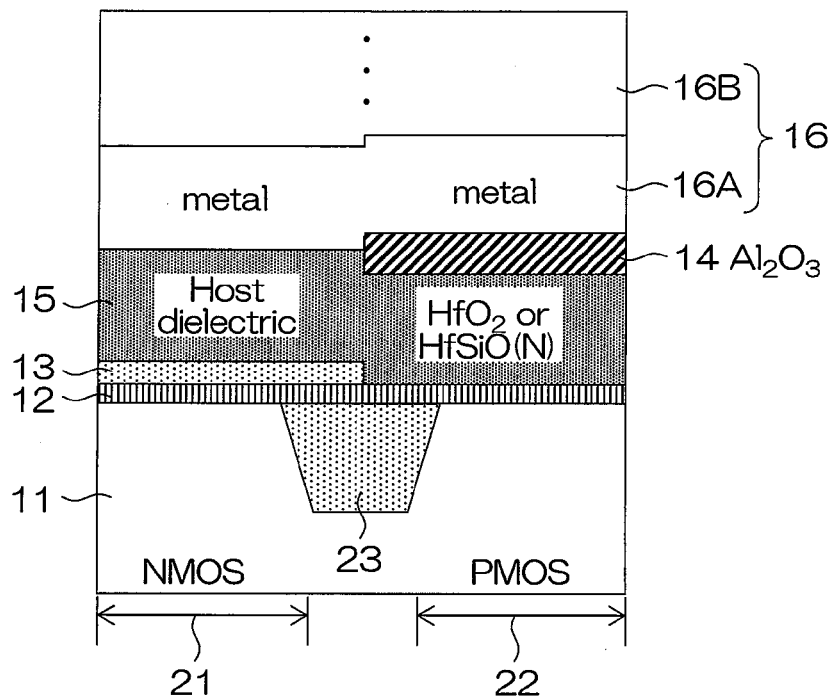
FIG. 7L (Gate patterning)
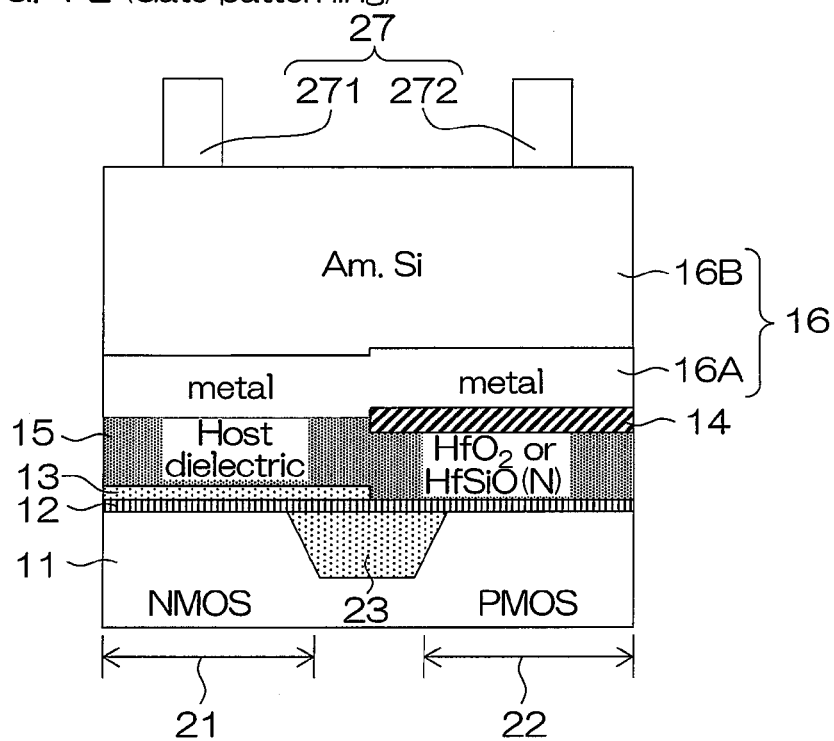

FIG. 7M (Gate etching)
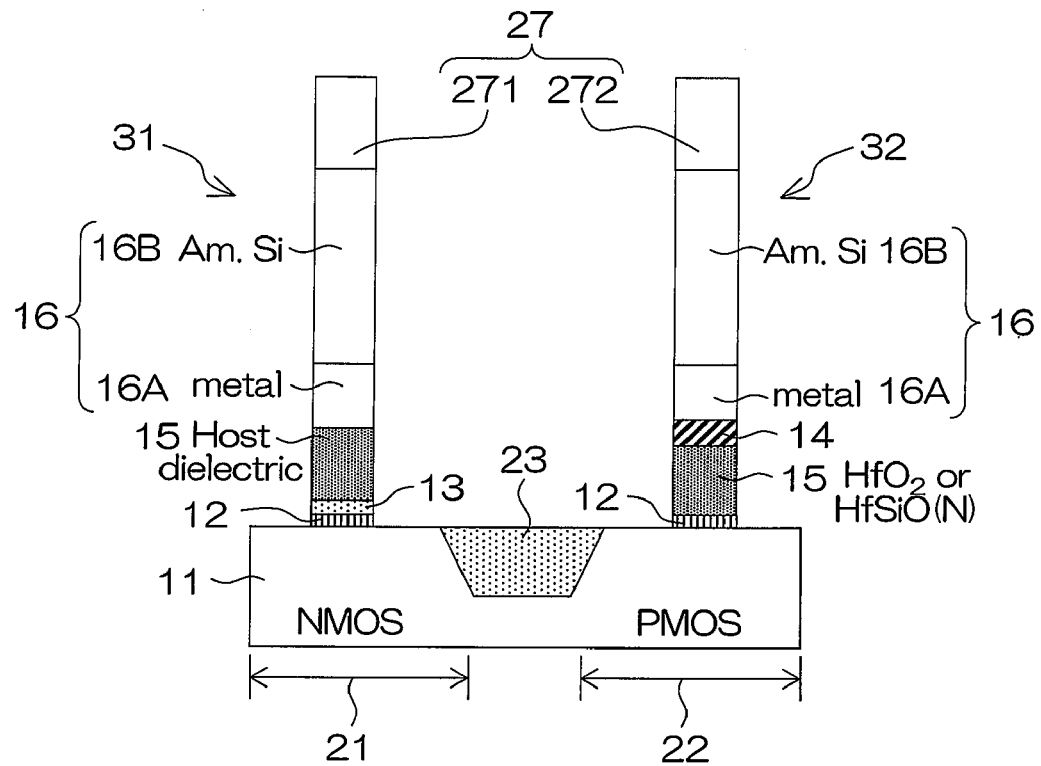
FIG. 7N (Hard mask removal)
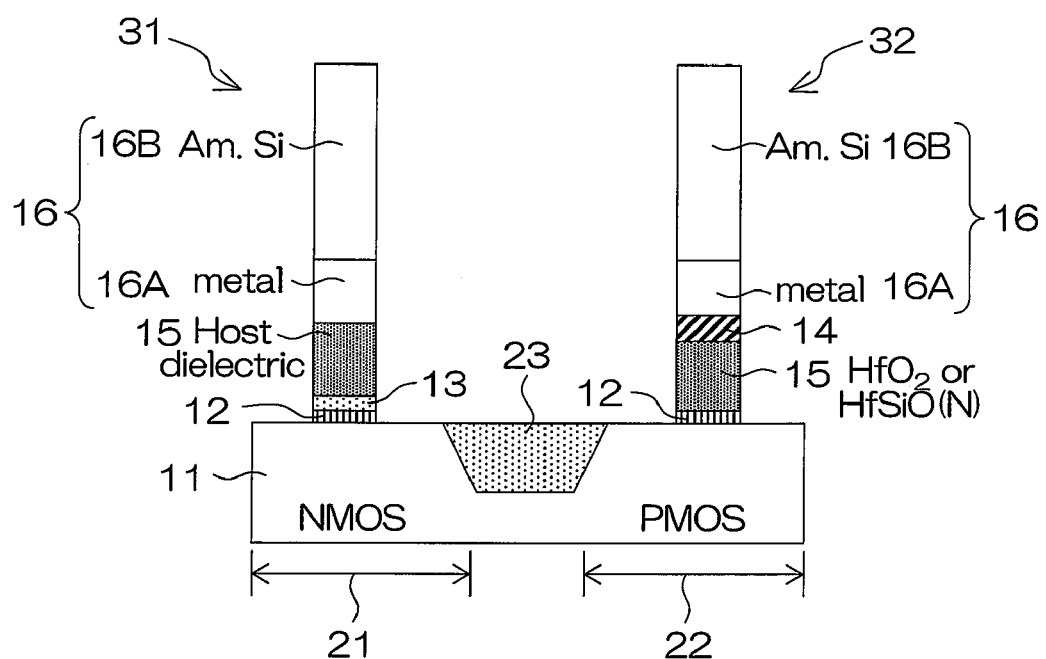

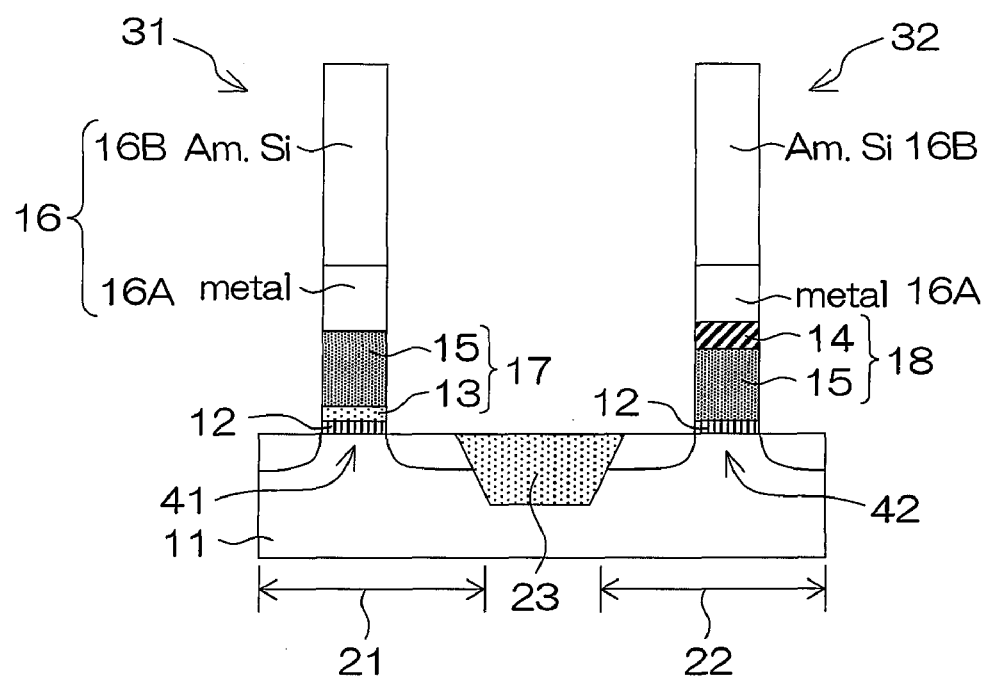
FIG. 7Q (Activation annealing)

SUBSTRATE TREATING METHOD AND METHOD OF MANUFACTURING SEMICONDUCTOR DEVICE USING THE SAME

BACKGROUND OF THE INVENTION

1. Field of the Invention

The present invention relates to a substrate treating method including a rinse step of supplying a rinse liquid to a substrate. Examples of substrates to be treated include a semiconductor wafer, a liquid display device substrate, a plasma display substrate, an FED (Field Emission Display) substrate, an optical disk substrate, a magnetic disk substrate, a magnetooptical disk substrate, and a photomask substrate. The present invention relates also to a method of manufacturing a semiconductor device using the substrate treating method.

2. Description of Related Art

For a gate insulating film of a field effect transistor (FET), silicon oxide has been conventionally used. To shrink the size of an element (or device) and highly integrate the same, it is necessary to reduce the thickness of the gate insulating film and secure sufficient on currents. However, rendering thin the gate insulating film made of silicon oxide has nearly reached its limit, and for a device of a technological generation in which a design rule is 32 nm, it is not possible to apply the oxide-silicon gate insulating film. This is because if an silicon oxide gate film having a film thickness of several atom layers is used, a leakage current due to the quantum tunneling effect increases.

Therefore, it has been considered to introduce a gate structure using a so-called High-k material, which is a high dielectric constant material of which the dielectric constant is higher than that of the silicon oxide. When such High-k material is applied to the gate insulating film, the film thickness can be increased to decrease the leakage current, and also a large amount of current can be flown similar to a case where a thin oxide-silicon gate insulating film is used.

A specific gate structure includes an interfacial oxide film formed on a silicon substrate surface, a High-k gate insulating film formed on the interfacial oxide film, and a gate metal (conductor film) formed on the High-k gate insulating film, for example. The interfacial oxide film is made of silicon dioxide. The interfacial oxide film suppresses a reduction in mobility $\mu$ due to a High-k gate insulating film, and improves the coating quality of High-k gate insulating film made of hafnium-coating material. As the High-k material, a hafnium-based material is expected to be the most suitable material. For the gate metal, titanium nitride and a tantalum-based material are selected in many cases. These gate metal materials have an intermediate value in work function, and thus, these are suitable materials when forming a CMOS (Complementary Metal Oxide Semiconductor) structure. This is because these materials can be commonly applied to N-channel MOSFET and P-channel MOSFET gate metals. When the gate metal materials are used in common, N-channel and P-channel MOSFET gate structures can be formed simultaneously at a common dry etching step.

The gate insulating film may be configured by a laminate film of a host High-k film having a large film thickness and a cap layer (High-k cap) having a small film thickness. The host High-k film is formed of a hafnium-based material, for example. The cap layer is formed to make contact with the host High-k film, and is made of a metal oxide film such as a lanthanum oxide, a magnesium oxide, or an aluminum oxide.

At an activation annealing step for forming source and drain regions, metal molecules within the cap layer are diffused to the host High-k film. Thereby, a threshold voltage can be shifted, and thus, a desired threshold voltage can be obtained. For example, when an N-channel MOSFET is formed, a cap layer is formed of a material having a work function approximate to that of N-type polysilicon. Likewise, when a P-channel MOSFET is formed, the cap layer is formed of a material having a work function approximate to that of P-type polysilicon. Thereby, the threshold voltages of the MOSFETs can be lowered.

Therefore, when the CMOS structure is formed, a cap layer formed of a material having a work function close to that of N-type polysilicon may be formed on the N-channel MOSFET side, and a cap layer formed of a material having a work function close to that of P-type polysilicon may be formed on the P-channel MOSFET side. Thereby, the threshold voltages of the respective P-channel and N-channel MOSFETs can be lowered while forming the gate metals of a common material.

Specifically, for the cap layer applied to the N-channel MOSFET (hereinafter, referred to as an "N-side cap layer"), a lanthanum oxide or a magnesium oxide having a low work function may be used. For the cap layer applied to the P-channel MOSFET (hereinafter, referred to as a "P-side cap layer"), an aluminum oxide having a high work function can be applied.

SUMMARY OF THE INVENTION

To flow a large amount of current, an electrical film thickness (EOT: equivalent oxide film thickness) of a gate insulating film needs to be reduced as much as possible, and thus, the film thickness of a cap layer is set to several atom layers (about 10 Å). Therefore, the requirements for film thickness control and uniformity for the cap layer are exacting. Further, since the deformation of the surface layer such as oxidation or roughening of the cap layer immediately leads to variation of the threshold voltage and an increase in electrical film thickness, this imposes a measurable influence on a transistor characteristic.

When metal oxide films different in the N-side cap layer and the P-side cap layer are used, patterning of these material films is indispensable. Specifically, the N-side cap layer is formed, and thereafter, the N-side cap layer needs to be selectively left in a region where the N-channel MOSFET is formed (hereinafter, referred to as an "NMOS region"). Likewise, the P-side cap layer is formed, and thereafter, the P-side cap layer needs to be selectively left in a region where the P-channel MOSFET is formed (hereinafter, referred to as a "PMOS region").

The cap layer can be patterned in a dry process or a wet process. The dry process includes a hard mask film formation on the cap layer, a photoresist mask formation on the hard mask, selective etching of the hard mask, stripping of the photoresist mask, selective dry etching of the cap layer, and stripping of the hard mask. On the other hand, the wet process includes a formation of a photoresist mask on the cap layer, selective wet etching of the cap layer, and stripping of the photoresist mask.

At each step of forming the cap layer, the substrate surface is cleaned. For cleaning, a chemical and deionized water (DIW) may be used, or the deionized water alone may be used. In either case, a rinse step at which deionized water is used is included. Therefore, in the dry process, after the formation of the cap layer, after the selective dry etching of the cap layer, and after stripping of the hard mask, the cap layer comes into contact with deionized water. In the wet process, after the formation of the cap layer, after the formation of the photoresist mask, after the selective wet etching of the cap layer, and after stripping of the photoresist film, the cap layer comes into contact with deionized water.

However, as a result of studies by the inventors of the present application, it has been revealed that when the cap layer contacted deionized water, apart of the material is lost and the film thickness decreases. This tendency appeared more significantly in the N-side cap layer, in particular.

One example of the experiment results is shown in FIG. 8. In this experiment, a deionized-water rinse treatment was performed on a semiconductor substrate of which the surface was formed with a lanthanum oxide ($La_xO_y$) film, which is one example of the N-side cap layer. The horizontal axis indicates a deionized-water rinse treatment time (DIW rinse time), and the vertical axis indicates an etching amount of a lanthanum oxide film (LaO etch amount). In the deionized-water rinse treatment, the semiconductor substrate was held horizontally by a spin chuck while being rotated, and the center of the semiconductor substrate was supplied with deionized water. It is seen from FIG. 8 that along with the elapse of the deionized-water rinse treatment time, the thickness of the lanthanum oxide film is decreased.

As described above, the cap layer is very thin, and thus, the requirements for the film thickness accuracy and the uniformity within the substrate surface are exacting. More specifically, when the film thickness of the cap layer is about 10 Å, a permissible range of a film loss is probably equal to or less than 1 Å, for example, in order to realize a good device characteristic. However, as shown in FIG. 8, the film loss by the deionized-water rinse treatment reached 1 Å only after seven seconds after the start of the treatment. This means that if one-minute deionized-water rinse is performed, the lanthanum oxide film having a film thickness of 10 Å will lose at least 40% of its film thickness. Therefore, the problem of the film loss occurring during the deionized-water rinse treatment is a challenge that must be overcome in order to produce a practical device using a High-k gate insulating film.

Until recently, there has been no report about the film loss of a cap layer by deionized-water rinse treatment. To further generalize the issue, there has been no report about a film loss when deionized-water rinse treatment is performed on a semiconductor substrate in a state where a rare earth oxide film or an alkaline earth oxide film is exposed. Therefore, the foregoing problem has been first found by the inventors of the present application, and as a matter of course, it is an unsolved problem.

The present invention provides a solution for such an unsolved problem.

A substrate treating method of the present invention includes: a step of preparing a semiconductor substrate in which at least a portion of an oxide film containing at least one of a rare earth oxide and an alkaline earth oxide is exposed; and a rinse step of supplying the oxide film on the semiconductor substrate with a rinse liquid made of an alkaline chemical (pH 7 to pH 14) or an organic solvent.

According to the studies by the inventors of the present application, when a rinse step is performed by using an alkaline chemical, a loss of a film made of a rare earth oxide or an alkaline earth oxide is more significantly decreased as compared to a rinse step using deionized water. Further, also when an organic solvent is used as the rinse liquid, a loss of a film made of a rare earth oxide or an alkaline earth oxide is more significantly decreased as compared to a case where deionized water is used as the rinse liquid. Therefore, when the substrate treating method according to the present invention is applied to manufacturing of a semiconductor device, the foregoing problem can be solved.

The rare earth oxide may include at least one selected from the group consisting of: a lanthanum oxide; a gadolinium oxide; a dysprosium oxide; and scandium oxide.

The alkaline earth oxide may include at least one selected from the group consisting of: a magnesium oxide, a strontium oxide, and barium oxide.

The alkaline chemical preferably is an alkaline aqueous solution of a pH of more than 7 (more preferably, 10 or more). The use of the alkaline aqueous solution having a pH of more than 7 (more preferably, 10 or more) enables a more effective film loss decrease.

The alkaline chemical may contain at least one selected from the group consisting of: ammonia water; a tetramethylammonium hydroxide aqueous solution (TMAH); a choline aqueous solution; sodium hydroxide aqueous solution; and potassium hydroxide aqueous solution.

The organic solvent may be an organic solvent that is soluble in water and shows neutral or alkaline. Some organic solvents are soluble in water and show acid. However, according to the studies by the inventors of the present application, organic solvents that are soluble in water and show neutral or alkaline are probably more advantageous for decreasing a film loss amount. Examples of such an organic solvent include: isopropyl alcohol (IPA); 1-butanol; 2-ethoxyethanol; 1-methoxy-2-propanol; 1,1,1,3,3,3-hexafluoro-2-propanol; hydrofluoroether (HFE); and methyl isobutyl ketone (MIBK).

The organic solvent preferably is a high concentration organic solvent having a concentration substantially 100% (not less than 99%, preferably 100%). More preferably, the moisture content of the high concentration organic solvent is not more than 1%.

The organic solvent may contain at least one selected from the group consisting of: alcohols; ethers; ketones; and amines. Examples of the alcohols include: isopropyl alcohol (IPA); 1-butanol; 2-ethoxyethanol; 1-methoxy-2-propanol; 1,1,1,3,3,3-hexafluoro-2-propanol; and tetrahydrofurfuryl alcohol (THFA). Examples of the ethers include hydrofluoroether (HFE). Examples of the ketones include methyl isobutyl ketone (MIBK). Examples of the amines include: N-methylpyrrolidone (NMP); and a dimethyl sulfoxide (DMSO).

More specifically, the organic solvent may contain at least one selected from the group consisting of: isopropyl alcohol (IPA); 1-butanol; 2-ethoxyethanol; 1-methoxy-2-propanol; 1,1,1,3,3,3-hexafluoro-2-propanol; tetrahydrofurfuryl alcohol (THFA); hydrofluoroether (HFE); methyl isobutyl ketone (MIBK); N-methylpyrrolidone (NMP); and a dimethyl sulfoxide (DMSO).

A film thickness decrease of the oxide film before and after the rinse step preferably is equal to or less than 1 Å. In other words, the composition, concentration, and temperature of the rinse liquid may be selected and a time for a rinse treatment may be set so that the film thickness decrease before and after the rinse step is equal to or less than 1 Å. When the rinse treatment time is set equal to or less than one minute (for example, 30 seconds to 60 seconds), an etching rate of the oxide film by the rinse liquid preferably equal to or less than 1 Å/minute. When the film thickness decrease is equal to or less than 1 Å, this rinse liquid can be applied to the step of forming the High-k cap, and a device having an excellent electrical characteristic can be formed.

The oxide film may be in contact with a high dielectric constant film of which the dielectric constant is higher than that of silicon oxide. Specifically, the high dielectric constant film may be used as the host High-k film. The oxide film may be used as the High-k cap film.

The high dielectric constant film may contain at least one selected from the group consisting of: a hafnium-containing material, alumina (aluminum oxide); and zirconia (zirconium oxide). These substances can be applied as a High-k material forming a gate insulating film.

In this case, the hafnium-containing material may contain at least one selected from the group consisting of: hafnium oxide; hafnium silicide; and hafnium nitride. More specifically, the hafnium-containing material may contain at least one selected from the group consisting of: HfO, HfON, HfSi, HfSiO, HfSiON, and HfTiO.

The substrate treating method may further include, after the rinse step, a dry step of eliminating a liquid on a surface of the semiconductor substrate. For example, the rinse step may include a step of rotating a substrate, and a step of supplying a rinse liquid to a surface of the substrate in a rotating state. The dry step may include a step of rotating the substrate after the supply of the rinse liquid is stopped so as to eliminate the liquid on the substrate surface by the centrifugal force. The dry step may include a step of supplying a volatile solvent such as isopropyl alcohol to the substrate surface. In this case, in order to eliminate the volatile solvent, the dry step may include a step of supplying an inert gas (for example, nitrogen gas) to the substrate surface.

The step of preparing a semiconductor substrate may include a removal step of removing a photoresist layer or a photoresist residue formed on the surface of the oxide film by a removal liquid thereby to expose at least a portion of the oxide film. For example, in order to pattern the oxide film, a patterned photoresist layer may be formed on the oxide film. The photoresist layer is used as a mask, and the oxide film is patterned (etched). After the patterning, a removal step of removing the photoresist film is performed. After this removal step, the rinse step is performed. In this case, the rinse step includes a step of replacing the removal liquid on the substrate used at the removal step, by the rinse liquid.

Further, a thin film on the substrate such as the oxide film or a substrate material itself may also be processed by dry etching. In this case, a pattern of the photoresist layer is formed on the substrate, and the dry etching is performed with the photoresist film used as a mask. Also, there is a case where, as a mask for selectively implanting ions on the substrate, the photoresist layer is used. In these cases, the photoresist hardened by the implanted ions are deposited, as a residue, on the substrate. There is also a case where an ashing treatment is performed on the photoresist film that has been used as the mask. On the substrate surface after the ashing, the residue of the photoresist is left. These residues are removed by the removal liquid. Subsequently, the removal liquid left on the substrate surface is replaced by the rinse liquid at the rinse step.

The removal liquid and the rinse liquid may have the same chemical composition. Thereby, the removal step and the rinse step can be performed continuously. In other words, at a single step, the removal of the photoresist layer or the photoresist residue, and the rinse treatment may be performed.

Although the removal liquid can be prepared only from organic solvent, the removal liquid may contain an additive. The additive may contain tetramethylammonium hydroxide (TMAH). Such an additive may be added to the removal liquid for the purpose of removing a BARC (Bottom Anti Reflective Coating), in particular a wet developable BARC, under a photoresist. In the case that tetramethylammonium hydroxide (TMAH) is added to the removal liquid as an additive, the concentration thereof in the removal liquid may preferably be 0.025% or higher.

A method of manufacturing a semiconductor device of the present invention is a method for manufacturing a semiconductor device by using a substrate treating method described above, in which the step of preparing a semiconductor substrate includes: a step of forming a laminate film, on a surface of the semiconductor substrate (may be a surface on which an interfacial layer is formed), obtained by laminating an oxide film containing at least one of a rare earth oxide and an alkaline earth oxide and a high dielectric constant film made from a material of which the dielectric constant is higher than that of silicon oxide; a step of forming a conductive film on the laminate film; and a gate forming step of forming a gate structure by patterning the conductive film and the laminate film thereby to expose at least a portion of the oxide film.

According to this method, a gate structure in which the laminate film is used as a gate insulating film can be formed. At this time, the loss of the oxide film at the rinse step can be suppressed, and thus, a device having an excellent characteristic can be formed.

According to one embodiment of the present invention, the step of forming a laminate film includes: a step of forming a photoresist mask in a predetermined region on the oxide film and etching (for example, wet etching) a part of the oxide film exposed from the photoresist mask; and a step of exposing the oxide film in the predetermined region by removing the photoresist mask after the etching, in which the rinse step is executed immediately after at least one of: the formation of the oxide film; the oxide film etching on the part exposed from the photoresist mask; the removal of the photoresist mask; and the gate forming step.

According to this method, by a so-called wet process, the gate structure can be formed. The loss of the oxide film at the rinse step can be suppressed, and thus, a device having an excellent characteristic may be formed. Immediately after the formation of the oxide film means before forming the photoresist mask after forming the oxide film. Immediately after the oxide film etching on the part exposed from the photoresist mask means before the removal of photoresist mask after the etching. Immediately after the removal of the photoresist mask means before the gate forming step after the removal of the photoresist mask. Immediately after the gate forming step means before performing other treatments such as the formation of a thin film on the substrate or implanting of ions into the substrate after the gate forming step. Generally, "immediately after" one step means before a subsequent step after the one step.

Moreover, in one embodiment of the present invention, the step of forming a laminate film includes: a first etching step of forming a first photoresist mask in a first region on the oxide film as a first oxide film, and etching a part of the first oxide film exposed from the first photoresist mask; a step of exposing the first oxide film in the first region by removing the first photoresist mask after the first etching step; a step of forming on the semiconductor substrate a second oxide film made of a material different from that in the first oxide film; a second etching step of forming a second photoresist mask in a second region different from the first region on the second oxide film and etching a part of the second oxide film exposed from the second photoresist mask; and a step of exposing the second oxide film in the second region by removing the second photoresist mask after the second etching step. Further, the gate forming step is a step of forming at least a pair of gate structures positioned in the first region and the second region, respectively. Moreover, the rinse step is executed immediately after at least one of: the formation of the first oxide film; the first oxide film etching on the part exposed from the first photoresist mask; the removal of the first photoresist mask;

the formation of the second oxide film; the second oxide film etching on the part exposed from the second photoresist mask; the removal of the second photoresist mask; and the gate forming step.

The first oxide film and the second oxide film may be made of metal oxides having different work functions.

According to this method, field effect transistors (MOSFETs) having different characteristics can be formed in the first and second regions. More specifically, a CMOS structure can be formed. In this case, the MOSFETs of the first and second regions can share the same gate metal material, and by functioning of the first and second oxide film, work functions of the entire gate insulating films can be adjusted. Thereby, with a simple process, a device having different work functions can be formed such as a CMOS structure. In this case, the loss of the oxide film at the rinse step can be inhibited, and thus, the electrical characteristic of the device can be improved.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
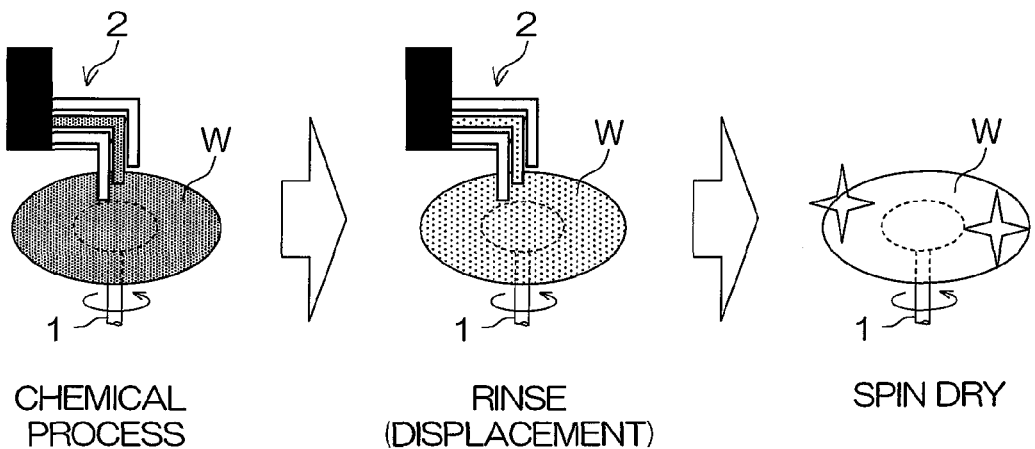
FIG. 1 is a diagram for explaining a substrate treating method according to a first embodiment of the present invention.

FIG. 1 is a diagram for explaining a substrate treating method according to a first embodiment of the present invention. The substrate treating method is executed by a single-wafer substrate treating device in which semiconductor substrates are treated one substrate at a time, for example. The substrate treating device is provided with a spin chuck 1 and a treatment liquid nozzle 2. The spin chuck 1 holds one semiconductor substrate W at a horizontal attitude, and rotates it around a vertical axis passing the center of the semiconductor substrate W. The treatment liquid nozzle 2 supplies a treatment liquid to the surface of the semiconductor substrate W held by the spin chuck 1. More specifically, the treatment liquid nozzle 2 discharges a chemical or a rinse liquid toward the surface of the substrate W.

The substrate W is a semiconductor substrate in a state where an oxide film made of a rare earth oxide or an alkaline earth oxide is formed. Examples of the rare earth oxide include a lanthanum oxide ($La_xO_y$), and in addition, a gadolinium oxide ($Gd_xO_y$), scandium oxide and a dysprosium oxide ($Dy_xO_y$) can also be used as the rare earth oxide. Moreover, an oxide film including a combination of two or more elements selected from these rare earth oxides may be formed on the surface of the substrate W. Examples of the alkaline earth oxide include a magnesium oxide ($Mg_xO_y$), barium oxide and a strontium oxide ($Sr_xO_y$). Moreover, an oxide film including a combination of two or more elements selected from these alkaline earth oxides may be formed on the surface of the substrate W. Further, an oxide film including a combination of at least one of the rare earth oxides and at least one of the alkaline earth oxides may be formed on the surface of the substrate W. Oxide films having different compositions may be formed at different positions on the substrate W.

A substrate treating method according to the first embodiment includes a chemical step, a rinse step, and a dry step. The rinse step is executed after the chemical step, and the dry step is executed after the rinse step.

The chemical step is a step at which the substrate W is treated with a chemical. More specifically, the substrate W is rotated by the spin chuck 1, and the chemical is discharged from the treatment liquid nozzle 2 toward the surface of the substrate W in a rotating state. The chemical discharged from the treatment liquid nozzle 2 may be a removal liquid for removing a photoresist or a photoresist residue. The chemical may be an etching liquid for etching a film on the substrate W (the oxide film or other films on the substrate W). Moreover, the chemical may be a cleaning liquid for removing a foreign substance (such as a particle) on the surface of the substrate W.

Usable as the removal liquid (resist stripping liquid) for removing (stripping) the photoresist is an organic solvent. In this case, examples of applicable organic solvent includes N-methylpyrrolidone (NMP); tetrahydrofurfuryl alcohol (THFA); and a dimethyl sulfoxide (DMSO). These organic solvents can be used alone or in combination of two or more kinds.

Although the removal liquid can be prepared only from organic solvent, the removal liquid can also be prepared by adding an additive into organic solvent. An example of such an additive is tetramethylammonium hydroxide (TMAH). Tetramethylammonium hydroxide may preferably be added such that the concentration thereof in the removal liquid is 0.025% or higher, for example. Such an additive may be added to the removal liquid for the purpose of removing a BARC (Bottom Anti Reflective Coating), in particular a wet developable BARC, under a photoresist.

The resist residue is, if the photoresist is used as a mask for dry etching, left on the substrate W after the dry etching. In a dry etching method, not only a treatment-targeted film but also the photoresist is eroded, and a part thereof changes quality and remains on the surface of the substrate as a polymer (resist residue). The dry etching may be applied when patterning films on the substrate W (the foregoing oxide film or other films on the substrate W). Usable as a polymer removal liquid for removing the polymer is at least one of: a liquid containing an organic alkaline solution; a liquid containing an organic acid; a liquid containing an inorganic acid; and a liquid containing an ammonium fluoride-based substance. Among these, examples of the liquid containing an organic alkaline solution include a liquid containing at least one of: DMF (dimethylformamide); DMSO (dimethylsulfoxide); hydroxylamine; and choline. Examples of the liquid containing an organic acid include a liquid containing at least one of: a citric acid; an oxolic acid; an iminodi acid; and a succinic acid. Examples of the liquid containing an inorganic acid include a liquid containing at least one of: a hydrofluoric acid; and a phosphoric acid. In addition thereto, examples of the polymer removal liquid include a liquid containing at least one of: 1-methyl-2-pyrrolidone; tetrahydrothiophene 1.1-dioxide; isopropanolamine; monoethanolamine; 2-(2-aminoethoxy)ethonal; catechol; N-methylpyrrolidone; aromatic diol; perclene (tetrachloroethylene); and phenol. More specifically, examples of the polymer removal liquid include a liquid containing at least one of: a mixture of 1-methyl-2-pyrrolidone, tetrahydrothiophene 1.1-dioxide, and isopropanolamine; a mixture of dimethyl sulfoxide and monoethanolamine; a mixture of 2-(2-aminoethoxy)ethanol, hydroxylamine, and catechol; a mixture of 2-(2-aminoethoxy)ethanol and N-methylpyrrolidone; a mixture of monoethanolamine, water, and aromatic diol; and a mixture of perclene (tetrachloroethylene) and phenol. Another example of the polymer removal liquid includes a liquid containing at least one of: one of amines such as triethanolamine and pentamethyl diethylenetriamine; propylene glycol, and dipropylene glycol monomethyl ether; and a similar substance.

Examples of the etching liquid include a hydrochloric acid, a hydrofluoric acid, ammonia water, and tetramethylammonium hydroxide (TMAH).

The cleaning liquid may be a particle removal liquid for removing particles on the surface of the substrate W. Examples of the particle removal liquid include an ammonia-hydrogen peroxide mixture.

The rinse step is a step at which the chemical is left on the surface of the substrate W after the chemical step is replaced with the rinse liquid. More specifically, the substrate W is rotated by the spin chuck 1, and the rinse liquid is discharged toward the surface of the substrate W in a rotating state, from the treatment liquid nozzle 2. The rinse liquid discharged from the treatment liquid nozzle 2 is an alkaline chemical (pH 7 to pH 14) or an organic solvent.

The alkaline chemical preferably is an alkaline aqueous solution of a pH of 10 or more. More specifically, the alkaline chemical may be a chemical containing at least one of: an ammonia water; a tetramethylammonium hydroxide aqueous solution (TMAH); a choline aqueous solution; a sodium hydroxide aqueous solution; and a potassium hydroxide aqueous solution.

An organic solvent that is usable as the rinse liquid may contain at least one element selected from the group consisting of: alcohols; ethers; ketones; and amines. More specifically, usable as the organic solvent is that which contains at least one of: isopropyl alcohol (IPA); 1-butanol; 2-ethoxyethanol; 1-methoxy-2-propanol; 1,1,1,3,3,3-hexafluoro-2-propanol; tetrahydrofurfuryl alcohol (THFA); hydrofluoroether (HFE); methyl isobutyl ketone (MIBK); N-methylpyrrolidone (NMP); and dimethyl sulfoxide (DMSO). These organic solvents may be used alone or in combination of two or more kinds.

The dry step is a step of eliminating the liquids left on the surface of the substrate W after the rinse step. More specifically, the substrate W is rotated at high speed (at 2000 rpm to 3000 rpm, for example) by the spin chuck 1 (so-called spin dry). Thereby, the liquids on the surface of the substrate W are eliminated outward of the substrate W by the centrifugal force. As a result, the substrate W is dried.

The dry step may include a step of supplying a volatile solvent on the surface of the substrate W held by the spin chuck 1. Examples of the volatile solvent include isopropyl alcohol (IPA) and hydrofluoroether (HFE). The volatile solvent means a solvent that is more volatile than water. When the volatile solvent is supplied to the surface of the substrate W, the drying of the surface of the substrate W can be promoted. From a certain point in the course of the step of supplying the volatile solvent or after the supply of the volatile solvent is stopped, an inert gas supplying step of supplying an inert gas (for example, nitrogen gas) toward the surface of the substrate W may be performed. This step permits prompt elimination of the volatile solvent from the surface of the substrate W, and thus, the dry step can be performed more promptly.

Figure 2:
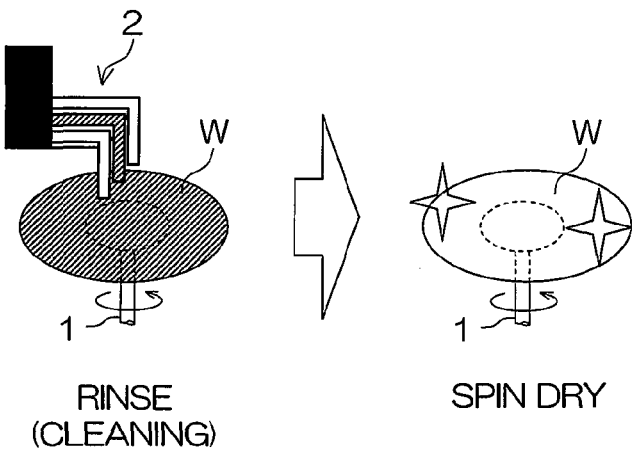
FIG. 2 is a diagram for explaining a substrate treating method according to a second embodiment of the present invention.

FIG. 2 is a diagram for explaining a substrate treating method according to a second embodiment of the present invention. The substrate treating method differs from that according to the first embodiment in that the chemical step is not included. That is, a rinse step of supplying the rinse liquid on the surface of the substrate W is performed, and thereafter, the dry step is performed. The details of the rinse step and the dry step are similar to those in the first embodiment. When there is no chemical on the surface of an untreated substrate W, a treatment at the rinse step in the second embodiment is not a treatment for replacing the chemical on the substrate W but a cleaning treatment for washing a foreign substance on the substrate W with the rinse liquid.

Figure 3:
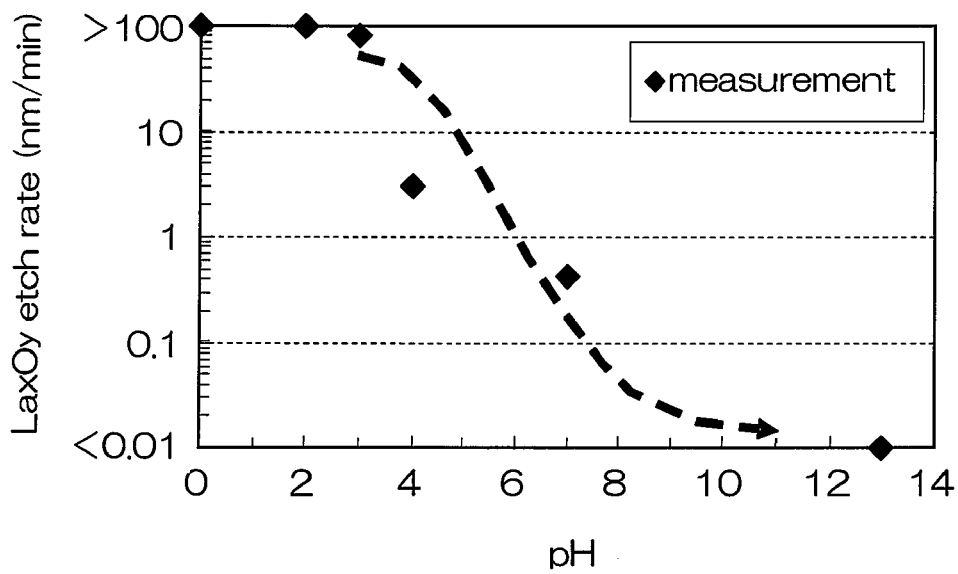
FIG. 3 is a graph showing a result obtained by examining a pH dependency of etching rates regarding a lanthanum oxide film.

FIG. 3 is a graph showing results obtained by examining the pH dependency of the etching rate for a lanthanum oxide film, which is one example of an oxide film made of a rare earth oxide. More specifically, a silicon substrate of which the surface was formed with the lanthanum oxide film was prepared. The silicon substrate was held by a spin chuck and rotated, and aqueous solutions of various pH values were supplied to the substrate. In this state, etching rates of the lanthanum oxide film ($La_xO_y$ etch rate) were measured. Measurements are indicated by a symbol "♦". The pH of the aqueous solution was adjusted by addition of a hydrochloric acid (HCl) and an ammonia water ($NH_4OH$).

As shown in FIG. 3, it was revealed that the etching rate of the lanthanum oxide film decreased as the pH increased.

Figure 4:
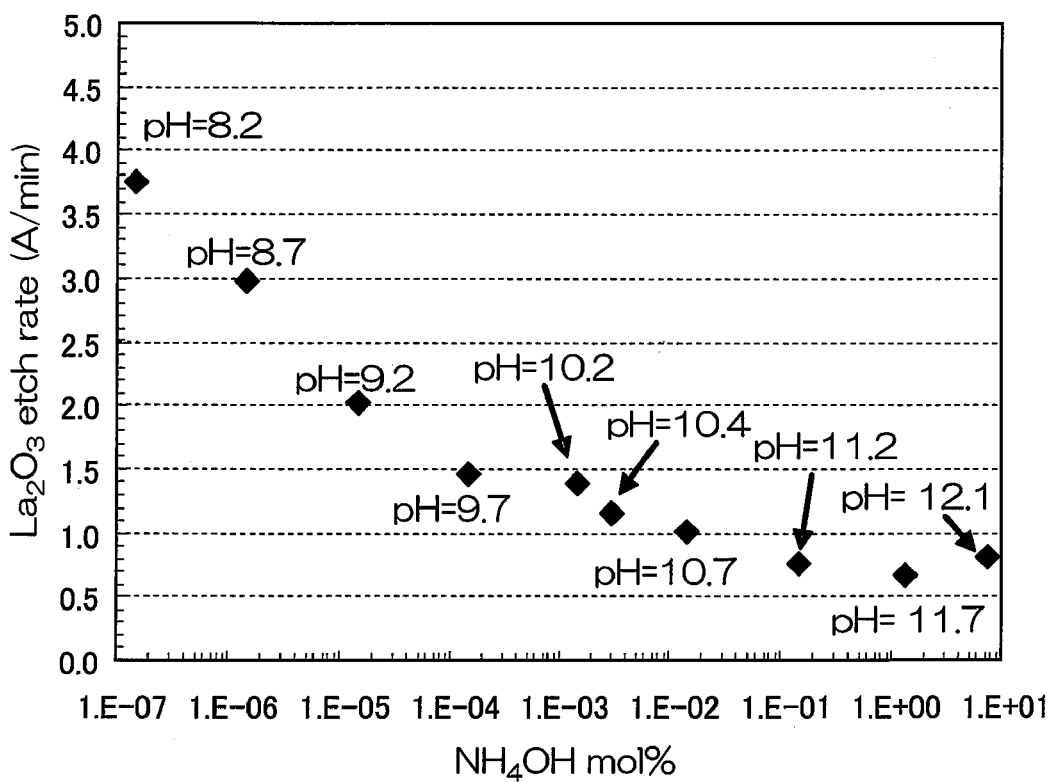
FIG. 4 is a graph showing a relationship between a loss of a lanthanum oxide film and a concentration of an ammonia water, which is one example of a rinse liquid.

FIG. 4 is a graph showing a relationship between etching rates of the lanthanum oxide film ($La_xO_y$ etch rate) and concentration of the ammonia water ($NH_4OH$), which is one example of the rinse liquid. It is seen that the higher the concentration of ammonia, the lower the etching rate. In spite of a slight difference, in a range of equal to or more than a pH of 10, etching rates of equal to or less than about 1 Å/min are realized. Therefore, it is seen that even when a rinse step of about one minute is performed, damage on the lanthanum oxide film can be sufficiently inhibited.

Figure 5:
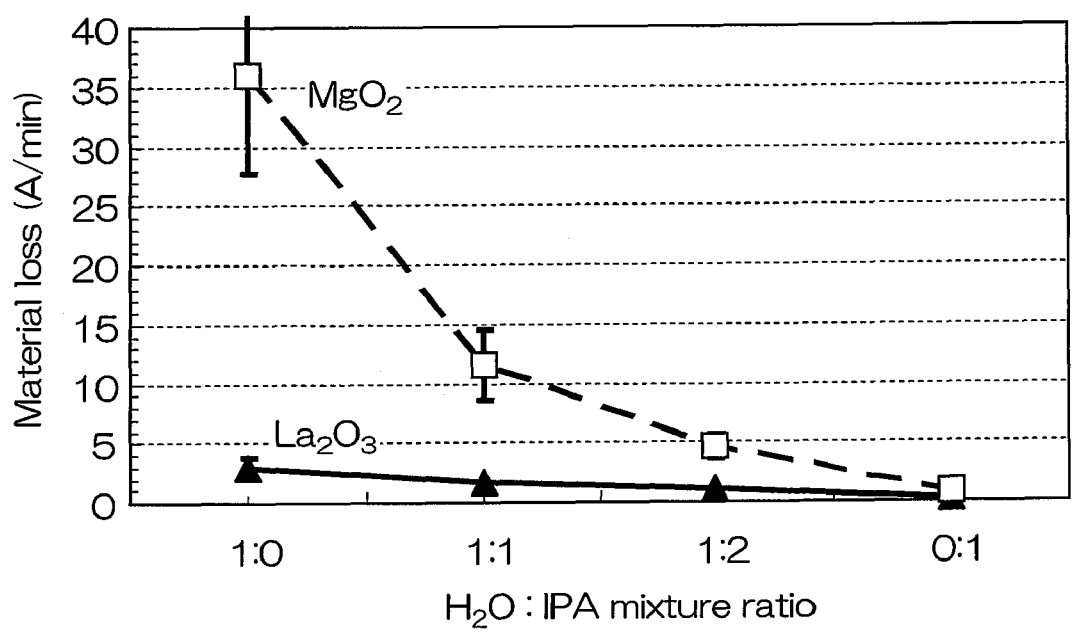
FIG. 5 is a graph showing a relationship between a loss of a lanthanum oxide film and a magnesium oxide film, and a concentration of an organic solvent, which is one example of a rinse liquid.

FIG. 5 is a graph showing a relationship between film losses of a lanthanum oxide film and a magnesium oxide film and concentration of an organic solvent, which is one example of the rinse liquid. A silicon substrate of which the surface is formed with the lanthanum oxide film was prepared. The silicon substrate was held by the spin chuck and rotated, and organic solvents of various concentrations were supplied to the substrate. The etching rates of the lanthanum oxide film (film loss per one minute) were measured. Further, a silicon substrate of which the surface was formed with a magnesium oxide film was prepared. The silicon substrate was held by the spin chuck and rotated, and organic solvents of various concentrations were supplied to the substrate. The etching rates of the magnesium oxide film (film loss per one minute) were measured. As the organic solvent, IPA (isopropyl alcohol) was used. The organic solvent was diluted by deionized water to various concentrations, and the resultant solvents were used as a rinse liquid and supplied to the substrate surface. In FIG. 5, the IPA concentrations are indicated by a mixture ratio with water. The measurements regarding the lanthanum oxide film are indicated by a symbol "▲". The measurements regarding the magnesium oxide film are indicated by a symbol "□".

As understood from FIG. 5, the higher the concentration of the organic solvent, the greater the decrease in the etching rate (film loss). When the organic solvent concentration is substantially equal to 100% (not less than 99%, preferably, 100%), the etching rate is equal to or less than 1 Å per one minute. In particular, when the 100% organic solvent is used, the loss of the lanthanum oxide film is substantially zero, and the etching rate of the magnesium oxide film is inhibited to about 0.7 Å/minute. Thereby, damage to the lanthanum oxide film or the magnesium oxide film can be sufficiently inhibited.

Figure 6:
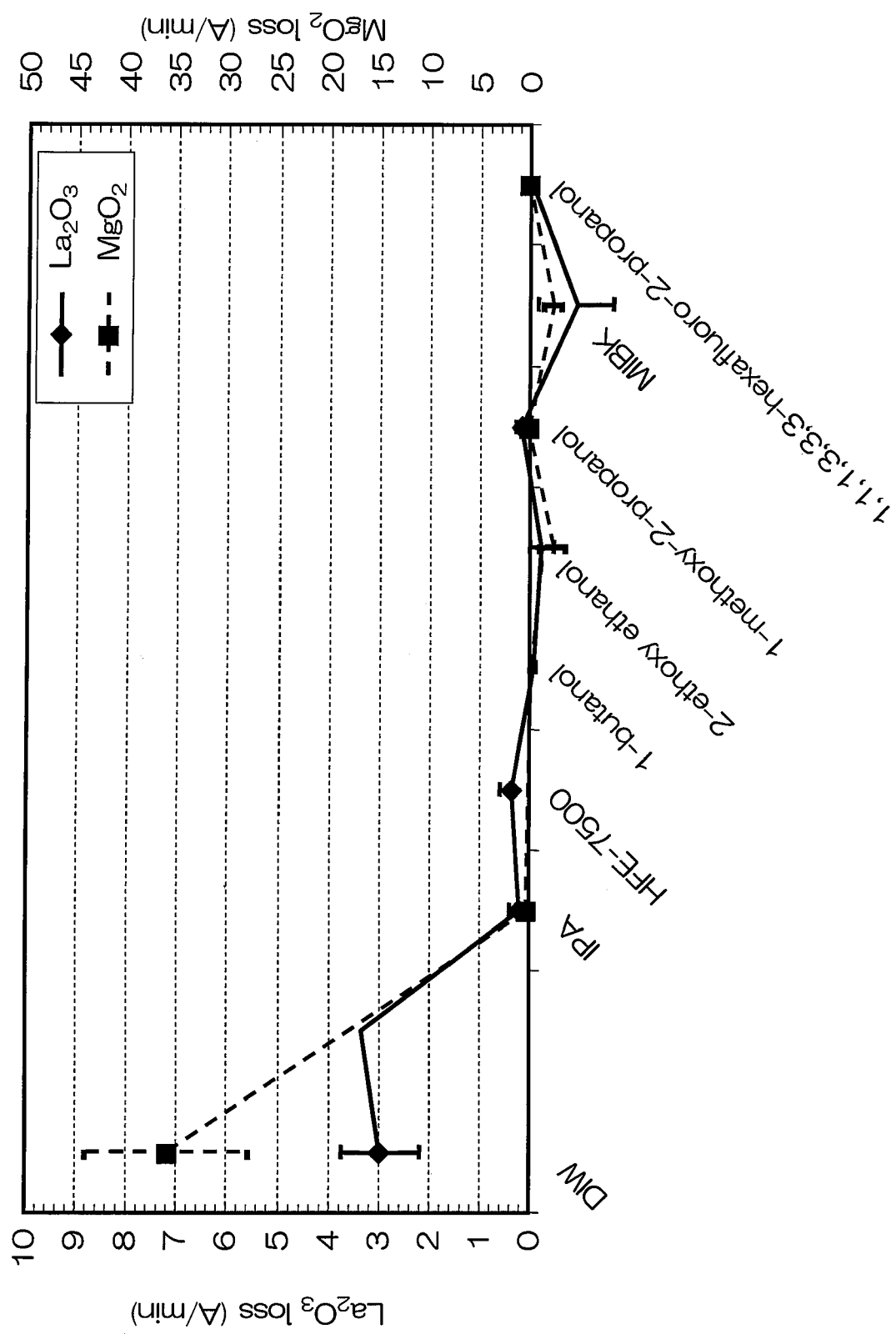
FIG. 6 is a graph showing a result obtained by examining a loss of a lanthanum oxide film and a magnesium oxide film regarding a case where various organic solvents are used as a rinse liquid.

FIG. 6 is a graph showing results obtained by examining a loss of a lanthanum oxide film ($La_2O_3$ loss) and a loss of a magnesium oxide film ($MgO_2$ loss) when various organic solvents are used as the rinse liquid. Left-hand scales represent a film loss (etching rate) of the lanthanum oxide film per one minute and right-hand scales represent a film loss (etching rate) of the magnesium oxide film per one minute. For comparison, measurement results of deionized water (DIW) are shown as well. The organic solvents used for the measurement were: isopropyl alcohol (IPA); hydrofluoroether (HFE), 1-butanol; 2-ethoxyethanol; 1-methoxy-2-propanol; methyl isobutyl ketone (MIBK); and 1,1,1,3,3,3-hexafluoro-2-propanol. All the organic solvents used had a concentration of substantially 100% (not less than 99%, preferably, 100%). As the hydrofluoroether, that which is provided by 3M Corporation as "Novec™ Engineered Fluid HFE-7500" was used. The chemical formula is n—$C_3F_7CF(OC_2H_5)CF(CF_3)_2$.

These organic solvents are all soluble in water and show neutral. From the measurement results of FIG. 6, it is seen that in all the organic solvents, the etching rate for the lanthanum oxide film and the magnesium oxide film are equal to or less than 1 Å/minute. As a result, when these organic solvents are used as the rinse liquid, the problem of the loss of the lanthanum oxide film and the magnesium oxide film can be overcome.

Figure 7A:
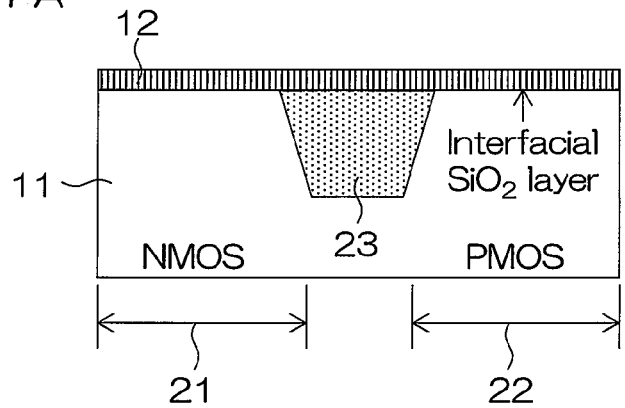
FIGS. 7A to 7Q are illustrative cross-sectional views each showing, in a sequence of steps, a method of manufacturing a semiconductor device according to a third embodiment of the present invention.
Figure 7A:
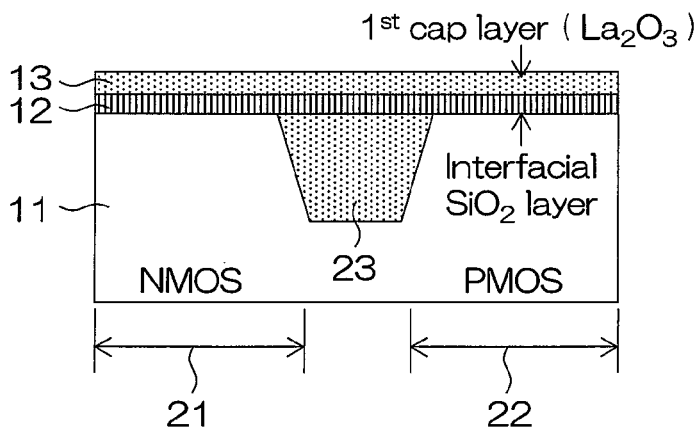
Figure 7A:
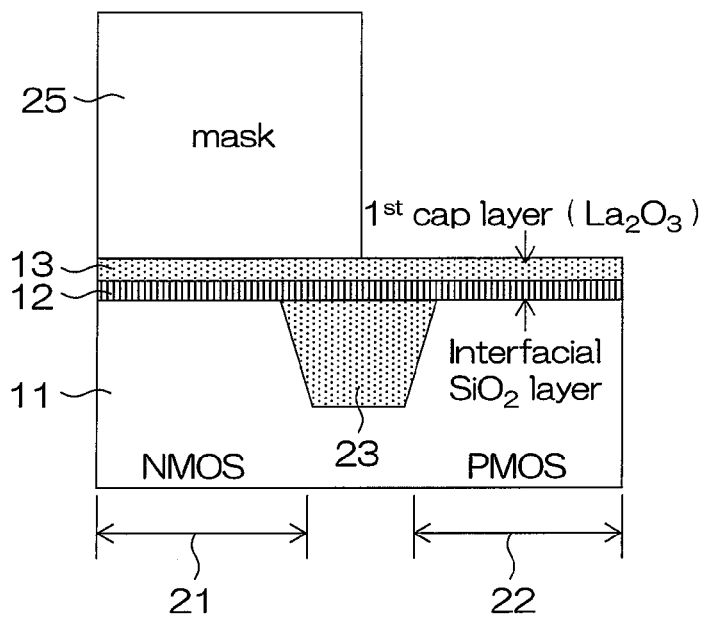
Figure 7O:
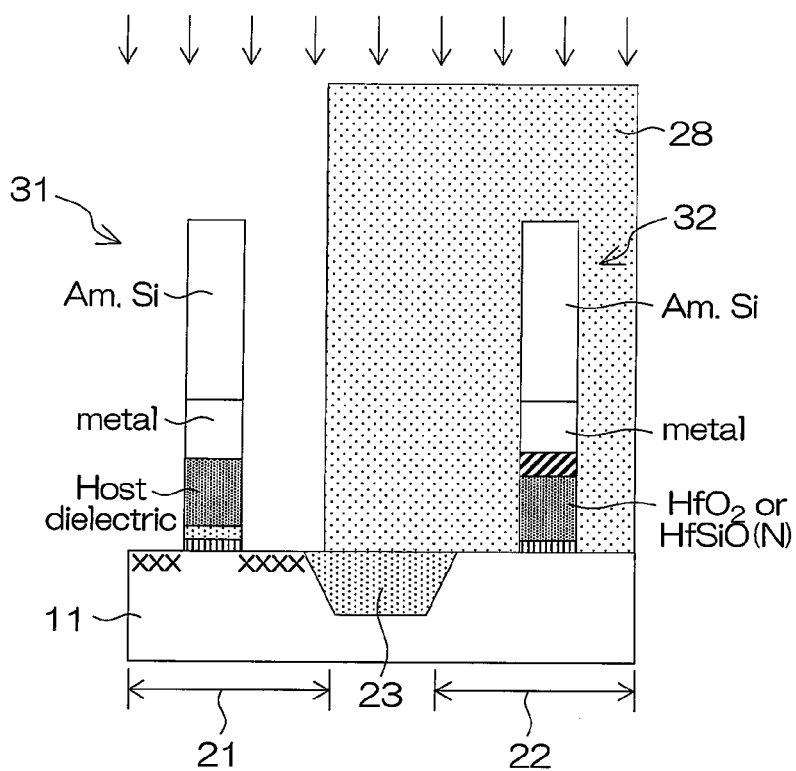

FIGS. 7A to 7Q are illustrative cross-sectional views each showing, in a sequence of steps, a method of manufacturing a semiconductor device according to a third embodiment of the present invention. FIGS. 7A to 7Q each show a step of manufacturing a semiconductor device having a CMOS structure.

As shown in FIG. 7A, a region of a surface layer portion of a device of the silicon substrate 11, which is a semiconductor substrate, is isolated into an NMOS region 21 (first region) in which a N-channel MOSFET is to be formed, and a PMOS region 22 (second region) in which a P-channel MOSFET is to be formed. Specifically, an isolation structure 23 for isolating the NMOS region 21 and the PMOS region 22 is formed. In an example of FIG. 7A, the isolation structure 23 is formed by an STI (Shallow Trench Isolation) structure. That is, the isolation structure 23 is formed by burying silicon oxide within a shallow trench formed by etching on the silicon substrate 11. Further, on the entire surface region of the silicon substrate 11, a thin interfacial layer 12 is formed. In the third embodiment, the interfacial layer 12 is made of silicon oxide ($SiO_2$) and has a film thickness of about 1 nm (10 Å). The interfacial layer 12 may be formed of a thermal oxide film.

A subsequent step is shown in FIG. 7B. On a surface of the silicon substrate 11 on which the interfacial layer 12 is formed (to be more exact, the surface of the interfacial layer 12), a first cap layer 13 (first oxide film) is formed. The first cap layer 13 is an N-side cap layer for decreasing a threshold voltage of the N-channel MOSFET. Applicable as the first cap layer 13 is a lanthanum oxide film or a magnesium oxide film. More generally, one kind of or a combination of at least two kinds of rare earth oxides and alkaline earth oxides may be a material of the first cap layer 13. Examples of the rare earth oxide include a lanthanum oxide, a gadolinium oxide, scandium oxide, and a dysprosium oxide. Examples of the alkaline earth oxide include a magnesium oxide, barium oxide and a strontium oxide. One of these substances may be used alone or at least two thereof may be used in an arbitrary combination. FIG. 7B shows an example in which the first cap layer 13 is formed of the lanthanum oxide film. The first cap layer 13 has a film thickness of about 1 nm (10 Å). To form the first cap layer 13, it is preferable to apply a PVD (Physical Vapor Deposition) method, in particular, an MOCVD (Metal Organic Chemical Vapor Deposition) method or an ALD (Atomic Layer Deposition) method capable of controlling the film thickness in the nm order.

After the film formation of the first cap layer 13, a cleaning treatment for removing a foreign substance on the surface of the silicon substrate 11 (including an exposed surface of the first cap layer 13) is performed. For the cleaning treatment the first embodiment (see FIG. 1) is applied with ammonia-hydrogen peroxide mixture used as the particle removal liquid. Alternatively, a substrate treating method of the second embodiment (see FIG. 2) is applied.

A subsequent step is shown in FIG. 7C. On the first cap layer 13, a photoresist mask 25 of a pattern that covers the first cap layer 13 in the NMOS region 21 and exposes the same in the PMOS region 22 is formed. The photoresist mask 25 is formed by photolithography.

A subsequent step is shown in FIG. 7D. By selective etching in which the photoresist mask 25 is used as a mask, the first cap layer 13 in the PMOS region 22 is selectively removed. Thereby, the first cap layer 13 is left in the NMOS region 21. The selective etching is executed by a wet process using a diluted hydrochloric acid (HCl), for example.

After the selective etching of the first cap layer 13, a cleaning treatment for removing a foreign substance on the surface of the silicon substrate 11 (including an exposed surface of the first cap layer 13) is performed. For the cleaning treatment, the substrate treating method of the second embodiment (see FIG. 2) is applied. When the step shown in FIG. 7D is regarded as a chemical step, the selective etching step of the first cap layer 13, and a rinse step and a dry step subsequent to the etching step correspond to the substrate treating method according to the first embodiment.

A subsequent step is shown in FIG. 7E. The photoresist mask 25 is removed (stripped). In the second embodiment, this removing treatment is executed by a wet process using a removal liquid (resist stripping liquid). Usable as the removal liquid (resist stripping liquid) for removing (stripping) the photoresist is an organic solvent. In this case, examples of applicable organic solvent includes N-methyl pyrrolidone (NMP); tetrahydrofurfuryl alcohol (THFA); and a dimethyl sulfoxide (DMSO). These organic solvents can be used alone or in combination of two or more kinds. Although the removal liquid can be prepared only from organic solvent as mentioned above, the removal liquid can also be prepared by adding an additive into organic solvent. An example of such an additive is tetramethylammonium hydroxide (TMAH). Tetramethylammonium hydroxide may preferably be added such that the concentration thereof in the removal liquid is 0.025% or higher, for example. Such an additive may be added to the removal liquid for the purpose of removing a BARC, in particular a wet developable BARC, under a photoresist.

After stripping of the photoresist mask 25, a cleaning treatment for removing a foreign substance on the surface of the silicon substrate 11 (including the exposed surface of the first cap layer 13) is performed. For the cleaning treatment, the substrate treating method of the second embodiment (see FIG. 2) is applied. When the step shown in FIG. 7E is regarded as a chemical step, a stripping step of the photoresist mask 25, and a rinse step and a dry step subsequent to the stripping step correspond to the substrate treating method according to the first embodiment.

A subsequent step is shown in FIG. 7F. On the surface of the silicon substrate 11, a host High-k film 15 is formed. The host High-k film 15 comes into contact with the first cap layer 13 in the NMOS region 21, and comes into contact with the interfacial layer 12 in the PMOS region 22. The host High-k film 15 is a high dielectric constant film formed of a High-k material (high dielectric constant material) having a higher dielectric constant than silicon oxide. The host High-k film 15 may contain at least one of a hafnium-containing material, almmina, and zirconia, for example. Selectable as the hafnium-containing material is one of or a combination of at least two of $HfO_2$, HfON, HfSi, HfSiO, HfSiON, and HfTiO. FIG. 7F shows an example in which the host High-k film 15 is formed of $HfO_2$, HfSiO or HfSiON. The host High-k film 15 forms a main body portion of a gate insulating film. The thickness of the host High-k film 15 is larger than that of the first cap layer 13, and is set to about 2 nm (20 Å), for example. For the formation of the host High-k film 15, an MOCVD method, an ALD method, and other PVD methods may be applied.

A subsequent step is shown in FIG. 7G. On the host High-k film 15, a second cap layer 14 (second oxide film) that comes into contact with the host High-k film 15 is formed. The second cap layer 14 is a P-side High-k cap layer for decreasing a threshold voltage of the P-channel MOSFET. As the second cap layer 14, an aluminum oxide (alumina: $Al_2O_3$) can be applied. In addition, aluminum nitride (AlN) can be applied as the second cap layer 14. The film thickness of the second cap layer 14 is smaller than that of the host High-k film 15, and is set to about 1 nm (10 Å). To form the second cap layer 14, it is preferable to apply a PVD method, in particular, an MOCVD method or an ALD method capable of controlling the film thickness in the nm order.

After the film formation of the second cap layer 14, a cleaning treatment for removing a foreign substance on the surface of the silicon substrate 11 (including an exposed surface of the second cap layer 14) is performed. For the cleaning treatment, the substrate treating method of the second embodiment (see FIG. 2) is applied. However, unless the first cap layer 13 is exposed in some region on the silicon substrate 11, the silicon substrate 11 may be rinsed by using deionized water (DIW) or other rinse liquids.

A subsequent step is shown in FIG. 7H. On the second cap layer 14, a photoresist mask 26 of a pattern that covers the second cap layer 14 in the PMOS region 22 and exposes the same in the NMOS region 21 is formed. The photoresist mask 26 is formed by photolithography.

After the formation of the photoresist mask 26, a cleaning treatment for removing a foreign substance on the surface of the silicon substrate 11 (including the exposed surface of the second cap layer 14) is performed. For the cleaning treatment, the substrate treating method of the second embodiment (see FIG. 2) may be applied. However, unless the first cap layer 13 is exposed in some region on the silicon substrate 11, the silicon substrate 11 may be rinsed by using deionized water (DIW) or other rinse liquids.

A subsequent step is shown in FIG. 7I. By selective etching in which the photoresist mask 26 is used as a mask, the second cap layer 14 in the NMOS region 21 is selectively removed. Thereby, the second cap layer 14 is left in the PMOS region 22. The selective etching is executed by a wet process using a diluted ammonia water or tetramethylammonium hydroxide aqueous solution (TMAH), for example.

After the selective etching of the second cap layer 14, a cleaning treatment for removing a foreign substance on the surface of the silicon substrate 11 (including exposed surfaces of the host High-k film 15 and the second cap layer 14) is performed. For the cleaning treatment, the substrate treating method of the second embodiment (see FIG. 2) may be applied. When the step shown in FIG. 7I is regarded as a chemical step, the selective etching step of the second cap layer 14, and a rinse step and a dry step subsequent to the etching step correspond to the substrate treating method according to the first embodiment. However, unless the first cap layer 13 is exposed in some region on the silicon substrate 11, the silicon substrate 11 may be rinsed by using deionized water (DIW) or other rinse liquids.

A subsequent step is shown in FIG. 7J. The photoresist mask 26 is removed (stripped). In the third embodiment, this removing treatment is executed by a wet process using a removal liquid (resist stripping liquid). Usable as the removal liquid (resist stripping liquid) for removing (stripping) the photoresist is an organic solvent. In this case, examples of applicable organic solvent includes N-methyl pyrrolidone (NMP); tetrahydrofurfuryl alcohol (THFA); and a dimethyl sulfoxide (DMSO). These organic solvents can be used alone or in combination of two or more kinds. Although the removal liquid can be prepared only from organic solvent as mentioned above, the removal liquid can also be prepared by adding an additive into organic solvent. An example of such an additive is tetramethylammonium hydroxide (TMAH). Tetramethylammonium hydroxide may preferably be added such that the concentration thereof in the removal liquid is 0.025% or higher, for example. Such an additive may be added to the removal liquid for the purpose of removing a BARC, in particular a wet developable BARC, under a photoresist.

After stripping of the photoresist mask 26, a cleaning treatment for removing a foreign substance on the surface of the silicon substrate 11 (including the exposed surfaces of the host High-k film 15 and the second cap layer 14) is performed. For the cleaning treatment, the substrate treating method of the second embodiment (see FIG. 2) may be applied. When the step shown in FIG. 7J is regarded as a chemical step, a stripping step of the photoresist mask 26, and a rinse step and a dry step subsequent to the stripping step correspond to the substrate treating method according to the first embodiment. However, unless the first cap layer 13 is exposed in some region on the silicon substrate 11, the silicon substrate 11 may be rinsed by using deionized water (DIW) or other rinse liquids.

A subsequent step is shown in FIG. 7K. A conductive film 16 is formed on the silicon substrate 11. In the third embodiment, the conductive film 16 is formed by laminating a metal film 16A and a polysilicon (amorphous silicon) film 16B. The metal film 16A comes into contact with the host High-k film 15 in the NMOS region 21 and comes into contact with the second cap layer 14 in the PMOS region 22. The polysilicon film 16B comes into contact with the metal film 16A. The metal film 16A is a so-called gate metal. The metal film 16A is formed of a titanium nitride (TiN) or tantalum-based conductive material, for example. Examples of the tantalum-based conductive material include tantalum nitride ($Ti_xN$) and tantalum carbide ($Ti_xC$). One element alone of these gate metal materials may be used, or a combination of at least two elements thereof may also be used. To form the metal film 16A, a sputtering method or other PVD methods may be applied. The formation of the polysilicon film 16B is realized by a vapor deposition method, for example.

After the formation of the metal film 16A and after the formation of the polysilicon film 16B each, the silicon substrate 11 is cleaned. For the substrate cleaning treatment, the substrate treating method of the second embodiment (see FIG. 2) may be applied. However, unless the first cap layer 13 is exposed in some region on the silicon substrate 11, the silicon substrate 11 may be rinsed by using deionized water (DIW) or other rinse liquids.

A subsequent step is shown in FIG. 7L. On the silicon substrate 11, a hard mask 27 for patterning a gate structure is formed. The hard mask 27 has a first mask portion 271 that comes into contact with the top surface of the conductive film 16 in the NMOS region 21 and a second mask portion 272 that comes into contact with the top surface of the conductive film 16 in the PMOS region 22. The hard mask 27 is formed of a material having durability against dry etching. More specifically, the hard mask 27 can be formed of silicon oxide, for example.

A step of forming the hard mask 27 includes the formation of the silicon oxide film on the conductive film 16 and patterning of the silicon oxide film (selective etching), for example. The formation of the silicon oxide film may be realized by a CVD (Chemical Vapor Deposition) method, for example. Patterning of the silicon oxide film may be realized by photolithography, for example. The photolithography includes a film formation of a photoresist film and patterning of the film formation of the photoresist film. After the selective etching of the silicon oxide film using the photoresist mask, the photoresist mask is removed (stripped).

In this case, after the formation of the silicon oxide film, after the patterning of the photoresist film, after the selective etching of the silicon oxide film, and after stripping of the photoresist mask each, the silicon substrate 11 is cleaned before moving to a subsequent step. For the substrate cleaning treatment, the substrate treating method of the second embodiment (see FIG. 2) may be applied. However, unless the first cap layer 13 is exposed in some region on the silicon substrate 11, the silicon substrate 11 may be rinsed by using deionized water (DIW) or other rinse liquids.

A subsequent step is shown in FIG. 7M. By dry etching using the hard mask 27 as a mask, the interfacial layer 12, the first cap layer 13, the second cap layer 14, the host High-k film 15, and the conductive film 16 are selectively etched. Thereby, a first gate structure 31 is formed in the NMOS region 21, and a second gate structure 32 is formed in the PMOS region 22. The gate metal (metal film 16A) is shared by the both NMOS region 21 and PMOS region 22, and thus, single dry etching can lead to the formation of the first and second gate structures 31 and 32.

After the formation of the first and second gate structures 31 and 32 by the dry etching, a cleaning treatment for removing a foreign substance on the surface of the silicon substrate 11 (including the exposed surface of the first cap layer 13) is performed. For the cleaning treatment, the substrate treating method of the second embodiment (see FIG. 2) is applied.

A subsequent step is shown in FIG. 7N. The hard mask 27 on the first and second gate structures 31 and 32 is removed. The removal of the hard mask 27 is realized by wet etching, for example. An etching solution used is a hydrofluoric acid, for example.

After the removal of the hard mask 27, a cleaning treatment for removing a foreign substance on the surface of the silicon substrate 11 (including the exposed surface of the first cap layer 13) is performed. For the cleaning treatment, the substrate treating method of the second embodiment (see FIG. 2) is applied. When the step shown in FIG. 7N is regarded as a chemical step, the removal step of the hard mask 27, and a rinse step and a dry step subsequent to the removal step correspond to the substrate treating method according to the first embodiment.

A subsequent step is shown in FIG. 7Q. A photoresist mask 28 of a pattern that covers the PMOS region 22 and exposes the NMOS region 21 is formed. Thereafter, N-type impurity ions are implanted in the silicon substrate 11. Thereby, in the NMOS region 21, an N-type impurity is introduced in a pair of regions (source and drain regions) isolated by the first gate structure 31.

Figure 7P:
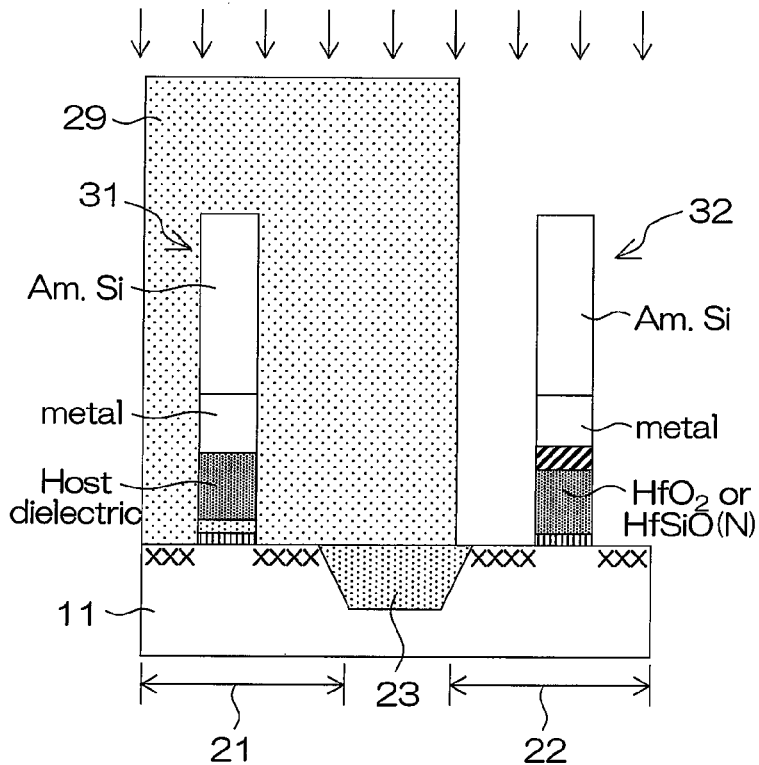
Figure 8:
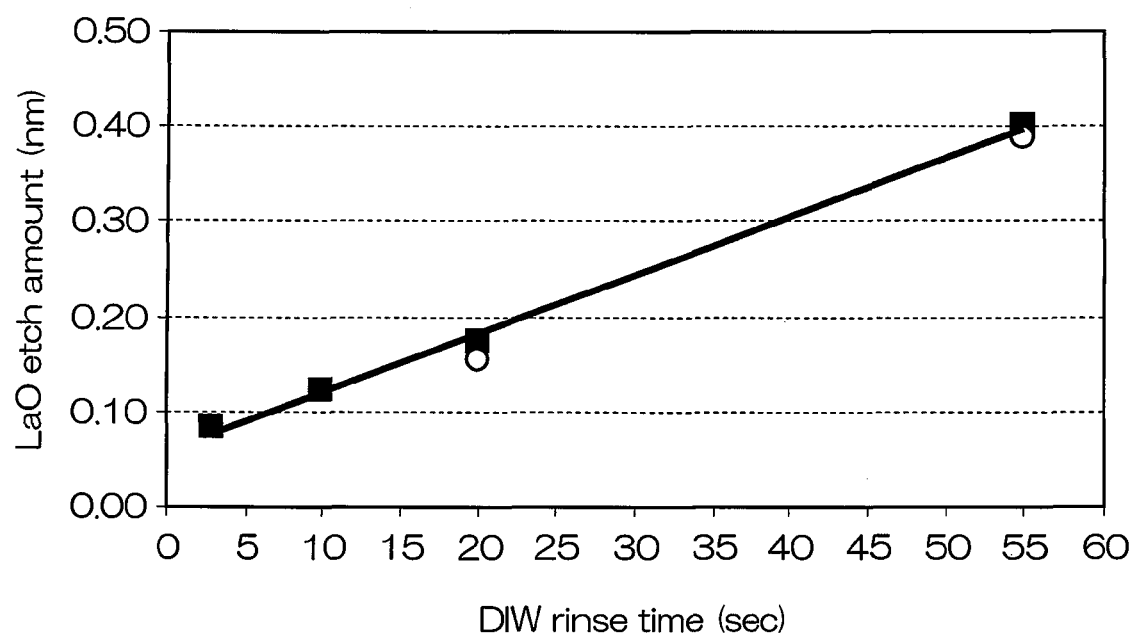
FIG. 8 is a graph for explaining a film loss by deionized water rinse.

A subsequent step is shown in FIG. 7P. The photoresist mask 28 is stripped and another photoresist mask 29 is formed. The photoresist mask 29 is formed in a pattern that covers the NMOS region 21 and exposes the PMOS region 22. Thereafter, P-type impurity ions are implanted in the silicon substrate 11. Thereby, in the PMOS region 22 a P-type impurity is introduced in a pair of regions (source and drain regions) isolated by the second gate structure 32.

Thereafter, as shown in FIG. 7Q, the photoresist mask 28 is stripped, and further, annealing for activating the N-type impurity and the P-type impurity introduced in the source and drain regions is performed. In this manner, the N-channel MOSFET 41 is formed in the NMOS region 21, and the P-channel MOSFET 42 is formed in the PMOS region 22. Therefore, the CMOS structure is obtained.

After stripping of the photoresist mask 28, and after stripping of the photoresist mask 29 each, a substrate cleaning treatment is performed before moving to a subsequent step. For the substrate cleaning treatment, the substrate treating method of the second embodiment (see FIG. 2) may be applied.

The photoresist masks 28 and 29 are eroded by ions arriving toward the silicon substrate 11, and a part thereof changes quality and remains on the surface of the substrate 11 as a polymer (resist residue). Therefore, the stripping treatment of the photoresist masks 28 and 29 is a treatment for removing the photoresist and its residue from the surface of the silicon substrate 11. The stripping treatment may be performed by using the foregoing removal liquid.

At the time of the foregoing activation annealing, metal molecules within the first and second cap layers 13 and 14 are diffused to the host High-k film 15. Thereby, both the N-channel MOSFET 41 and the P-channel MOSFET 42 can have a low threshold voltage. That is, the first gate insulating film 17 made of a laminate film of the host High-k film 15 and the first cap layer 13 has a work function suitable for the N-channel MOSFET 41. Further, the second gate insulating film 18 made of a laminate film of the host High-k film 15 and the second cap layer 14 has a work function suitable for the P-channel MOSFET 42. In this way, while using one type of gate metal material, both the N-channel MOSFET 41 and the P-channel MOSFET 42 can have low threshold voltages.

In the third embodiment, for the rinse step in a state where the first cap layer 13 is exposed, the alkaline chemical or the organic solvent is used as a rinse liquid. This inhibits the film loss of the first cap layer 13, and thus, the N-channel MOS- FET 41 has a stable, low threshold voltage. Thereby, it becomes possible to produce a CMOS device having an excellent characteristic.

As described above, the three embodiments of the present invention have been described; however, the present invention can also be further implemented in other embodiments.

For example, in the foregoing third embodiment, the N-side cap layer 13, the host High-k film 15, and the P-side cap layer 14 are formed in this order. However, this formation order can be modified. For example, the P-side cap layer 14, the host High-k film 15, and the N-side cap layer 13 may be formed in this order. Also, both the cap layers 13 and 14 may be formed before the host High-k film 15 (that is, below the host High-k film 15). Further, both the cap layers 13 and 14 may be formed after the host High-k film 15 (that is, above the host High-k film 15). In these cases, either one of the cap layers 13 or 14 may be formed first.

In the third embodiment, there is illustrated a "gate-first" process in which the gate structure is formed before the formation of the source and drain layers. However, a "gate-last" process in which the gate structure is formed after the formation of the source and drains layers may be adopted.

In the third embodiment, the example in which patterning of the cap layers 13 and 14 is performed by a wet process is described. However, these layers 13 and 14 can be patterned by a dry process. This dry process includes the formation of a hard mask material film (for example, silicon oxide or polysilicon), a formation of a photoresist mask on the hard mask material film, selective dry etching of the hard mask material film, stripping of a photoresist mask, selective etching of the cap layers 13 and 14, and stripping of a hard mask. It is preferable to perform the cleaning treatment by the substrate treating method according to the second embodiment before moving to a subsequent step immediately after each of these steps. In particular, in the patterning of the N-side cap layer 13, when the alkaline chemical or the organic solvent is used as the rinse liquid, the film loss of the cap layer 13 can be inhibited. There is a concern that the dry process includes a number of steps, and damage is caused to the cap layers 13 and 14. A chemical used for stripping the hard mask is generally a hydrofluoric acid. However, the hydrofluoric acid does not necessarily have sufficient etching selectivity for a hafnium-based host High-k film. Therefore, it can be said that the wet process is more advantageous. It is noted that at a stripping step of the photoresist film after the dry etching, not only the photoresist but also the resist residue occurring at the time of the dry etching are removed.

Further, in the third embodiment, a method of manufacturing a semiconductor device having a CMOS structure is shown. However, the present invention can also be applied to manufacturing of a semiconductor device having an N-channel MOSFET only on a semiconductor substrate, for example. As a matter of course, the present invention may be applied to manufacturing of nonvolatile memories and other memory devices.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The present application corresponds to Japanese Patent Application No. 2009-140740 filed in the Japan Patent Office on Jun. 12, 2009, and the entire disclosure of the application is incorporated herein by reference.

What is claimed is:

1. A method of manufacturing a semiconductor device, comprising:
   a step of preparing a semiconductor substrate which has an oxide film containing at least one of a rare earth oxide and an alkaline earth oxide, at least a portion of the oxide film being exposed; and
   a rinse step of supplying the oxide film on the semiconductor substrate with a rinse liquid made of an alkaline chemical or an organic solvent;
   wherein the step of preparing a semiconductor substrate includes:
   a step of forming a laminate film on a surface of the semiconductor substrate, the laminate film being obtained by laminating an oxide film containing at least one of a rare earth oxide and an alkaline earth oxide, and a high dielectric constant film made from a material of which the dielectric constant is higher than that of silicon oxide;
   a step of forming a conductive film on the laminate film; and
   a gate forming step of forming a gate structure by patterning the conductive film and the laminate film thereby to expose at least a portion of the oxide film; and
   the step of forming a laminate film includes:
   a step of forming a photoresist mask in a predetermined region on the oxide film and etching the oxide film exposed from the photoresist mask; and
   a step of exposing the oxide film in the predetermined region by removing the photoresist mask after the etching, wherein
   the rinse step is executed immediately after at least one of: the formation of the oxide film; the oxide film etching on the part exposed from the photoresist mask; the removal of the photoresist mask; and the gate forming step.

2. A method of manufacturing a semiconductor device comprising:
   a step of preparing a semiconductor substrate which has an oxide film containing at least one of a rare earth oxide and an alkaline earth oxide, at least a portion of the oxide film being exposed; and
   a rinse step of supplying the oxide film on the semiconductor substrate with a rinse liquid made of an alkaline chemical or an organic solvent;
   wherein the step of preparing a semiconductor substrate includes:
   a step of forming a laminate film on a surface of the semiconductor substrate, the laminate film being obtained by laminating an oxide film containing at least one of a rare earth oxide and an alkaline earth oxide, and a high dielectric constant film made from a material of which the dielectric constant is higher than that of silicon oxide;
   a step of forming a conductive film on the laminate film; and
   a gate forming step of forming a gate structure by patterning the conductive film and the laminate film thereby to expose at least a portion of the oxide film; and
   the step of forming the laminate film includes:
   a first etching step of forming a first photoresist mask, in a first region on the oxide film as a first oxide film, and etching a part of the first oxide film exposed from the first photoresist mask;
   a step of exposing the first oxide film in the first region by removing the first photoresist mask after the first etching step;

a step of forming on the semiconductor substrate a second oxide film made of a material different from that of the first oxide film;

a second etching step of forming a second photoresist mask in a second region different from the first region on the second oxide film and etching a part of the second oxide film exposed from the second photoresist mask; and a step of exposing the second oxide film in the second region by removing the second photoresist mask after the second etching step, the gate forming step including a step of forming at least a pair of gate structures positioned in the first region and the second region, respectively, wherein the rinse step is executed immediately after at least one of: the formation of the first oxide film; the first oxide film etching on the part exposed from the first photoresist mask; the removal of the first photoresist mask; the formation of the second oxide film; the second oxide film etching on the part exposed from the second photoresist mask; the removal of the second photoresist mask; and the gate forming step.

3. The method of manufacturing a semiconductor device according to claim 2, wherein the first oxide film and the second oxide film are made of metal oxides having different work functions.

* * * * *